US011527700B2

(12) United States Patent
Qian et al.

(10) Patent No.: US 11,527,700 B2
(45) Date of Patent: Dec. 13, 2022

(54) MICROPHONE DEVICE WITH SINGLE CRYSTAL PIEZOELECTRIC FILM AND METHOD OF FORMING THE SAME

(71) Applicant: VANGUARD INTERNATIONAL SEMICONDUCTOR SINGAPORE PTE. LTD., Singapore (SG)

(72) Inventors: You Qian, Singapore (SG); Joan Josep Giner De Haro, Singapore (SG); Rakesh Kumar, Singapore (SG)

(73) Assignee: VANGUARD INTERNATIONAL SEMICONDUCTOR SINGAPORE PTE. LTD., Singapore (SG)

( * ) Notice: Subject to any disclaimer, the term of this patent is extended or adjusted under 35 U.S.C. 154(b) by 450 days.

(21) Appl. No.: 16/722,143

(22) Filed: Dec. 20, 2019

(65) Prior Publication Data

US 2021/0193899 A1 Jun. 24, 2021

(51) Int. Cl.
*H01L 41/053* (2006.01)
*H01L 41/047* (2006.01)
*H01L 41/08* (2006.01)
*H04R 17/02* (2006.01)
*H01L 41/297* (2013.01)

(52) U.S. Cl.
CPC ........ *H01L 41/053* (2013.01); *H01L 41/0472* (2013.01); *H01L 41/0805* (2013.01); *H01L 41/297* (2013.01); *H04R 17/02* (2013.01)

(58) Field of Classification Search
None
See application file for complete search history.

(56) References Cited

U.S. PATENT DOCUMENTS

| 5,430,344 | A | * | 7/1995 | Takeuchi | H01L 41/0973 310/330 |
|---|---|---|---|---|---|
| 6,004,644 | A | * | 12/1999 | Takeuchi | H01L 41/0973 264/603 |
| 7,586,239 | B1 | | 9/2009 | Li et al. | |
| 8,531,088 | B2 | | 9/2013 | Grosh et al. | |
| 9,107,017 | B1 | * | 8/2015 | Chiu | B81C 1/00476 |
| 2005/0193822 | A1 | * | 9/2005 | Amano | G06V 40/1306 73/704 |
| 2008/0122317 | A1 | * | 5/2008 | Fazzio | H04R 17/02 381/173 |
| 2016/0090300 | A1 | * | 3/2016 | Tsai | H04R 17/02 257/254 |
| 2016/0111625 | A1 | * | 4/2016 | Nunan | H01L 41/047 216/13 |
| 2017/0069820 | A1 | * | 3/2017 | Hada | H03H 3/02 |

(Continued)

*Primary Examiner* — Scott B Geyer
(74) *Attorney, Agent, or Firm* — Winston Hsu

(57) ABSTRACT

A microphone device may include: a substrate wafer, a support member bonded to a front surface of the substrate wafer, a single-crystal piezoelectric film provided over the support member, a top electrode and a bottom electrode. The single-crystal piezoelectric film may have a first surface and an opposing second surface. The top electrode may be arranged adjacent to the first surface of the single-crystal piezoelectric film. The bottom electrode may be arranged adjacent to the second surface of the single-crystal piezoelectric film. The substrate wafer may have a through-hole formed therein. The through-hole of the substrate wafer may be at least substantially aligned with at least one of the top electrode and the bottom electrode.

11 Claims, 8 Drawing Sheets

(56) References Cited

U.S. PATENT DOCUMENTS

| | | | | |
|---|---|---|---|---|
| 2017/0246662 | A1* | 8/2017 | Kidwell, Jr. | H01L 41/081 |
| 2018/0007473 | A1* | 1/2018 | Cargill | H04R 19/04 |
| 2018/0297834 | A1* | 10/2018 | Renaud-Bezot | B81C 1/00873 |
| 2019/0036003 | A1* | 1/2019 | Xia | H01L 41/0533 |
| 2019/0189898 | A1* | 6/2019 | Sieber | H01L 41/1138 |
| 2019/0327562 | A1* | 10/2019 | Cerini | B81B 3/0021 |
| 2020/0076331 | A1* | 3/2020 | Song | H01L 41/1134 |
| 2020/0148532 | A1* | 5/2020 | Grosh | B81B 7/02 |
| 2020/0313073 | A1* | 10/2020 | Wang | B81B 7/0025 |
| 2021/0050506 | A1* | 2/2021 | Xia | H01L 41/1136 |
| 2021/0247187 | A1* | 8/2021 | Soejima | H01L 41/053 |

* cited by examiner

MICROPHONE DEVICE WITH SINGLE CRYSTAL PIEZOELECTRIC FILM AND METHOD OF FORMING THE SAME

TECHNICAL FIELD

Various embodiments relate to microphone devices and methods of forming a microphone device.

BACKGROUND

Existing microphone devices manufactured using semiconductor technology typically suffers from yield loss caused by stress mismatches within the piezoelectric material. To compensate for the stress mismatch, some microphone devices include two layers of piezoelectric layers with opposing stress distribution. However, it is challenging to achieve consistency in the performance of such microphone devices, as the piezoelectric layer in different devices may bend differently due to poor stress uniformity in the piezoelectric layers, causing the dimensions of the air gaps in the microphone devices to vary.

SUMMARY

According to various embodiments, there may be provided a microphone device. The microphone device may include: a substrate wafer, a support member bonded to a front surface of the substrate wafer, a single-crystal piezoelectric film provided over the support member, a top electrode and a bottom electrode. The single-crystal piezoelectric film may have a first surface and an opposing second surface. The top electrode may be arranged adjacent to the first surface of the single-crystal piezoelectric film. The bottom electrode may be arranged adjacent to the second surface of the single-crystal piezoelectric film. The substrate wafer may have a through-hole formed therein. The through-hole of the substrate wafer may be at least substantially aligned with at least one of the top electrode and the bottom electrode.

According to various embodiments, there may be provided a method of forming a microphone device. The method may include: forming a through-hole in a substrate wafer; providing a second wafer; bonding the second wafer to the substrate wafer; and forming a top electrode over a first surface of a single-crystal piezoelectric film of the second wafer. The second wafer may include the single-crystal piezoelectric film. The single-crystal piezoelectric film may have a first surface and an opposing second surface. The second wafer may further include a bottom electrode arranged adjacent to the second surface, and a support member over the single-crystal piezoelectric film. The through-hole in substrate wafer may be at least substantially aligned with at least one of the top electrode and the bottom electrode.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Embodiments described below in context of the devices are analogously valid for the respective methods, and vice versa. Furthermore, it will be understood that the embodiments described below may be combined, for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

In order that the invention may be readily understood and put into practical effect, various embodiments will now be described by way of examples and not limitations, and with reference to the figures.

According to various non-limiting embodiments, a microphone device may include a thin film of single-crystal piezoelectric material bonded to a Complementary Metal-Oxide-Semiconductor (CMOS) wafer or other types of active substrates. The microphone device may include a top electrode and a bottom electrode patterned onto opposing sides of the thin film of single-crystal piezoelectric material. A single-crystal piezoelectric film, as compared to polycrystalline piezoelectric material deposited by physical vapor deposition (PVD), has the advantage of having no internal stresses. It is thus possible to achieve uniformity of stress distribution, and to obtain consistent performance in the microphone device. Single-crystal piezoelectric film may exhibit the desirable piezoelectric properties that might be offered by a polycrystalline ceramic element if all of its domains were perfectly aligned. Suitable materials for the single-crystal piezoelectric film may include aluminum nitride (AlN), scandium aluminum nitride (SLAIN), lead magnesium niobate-lead titanate (PMN-PT), lead zirconate niobate-lead titanate (PZN-PT), lithium niobate (LiNbO3), lithium tetraborate (Li2B4O7), quartz and barium titanate (BaTiO3).

The starting material for fabricating the microphone device may be a piezoelectric-on-insulator (POI) wafer with tight thickness control and uniformity. Using the POI wafer as a starting material may allow the thin film of piezoelectric material to be transferred onto another substrate, such as a CMOS wafer, before the device features are fabricated onto the piezoelectric material. The quality of the thin film may be also be maintained even when the thickness is reduced.

Figure 1A:
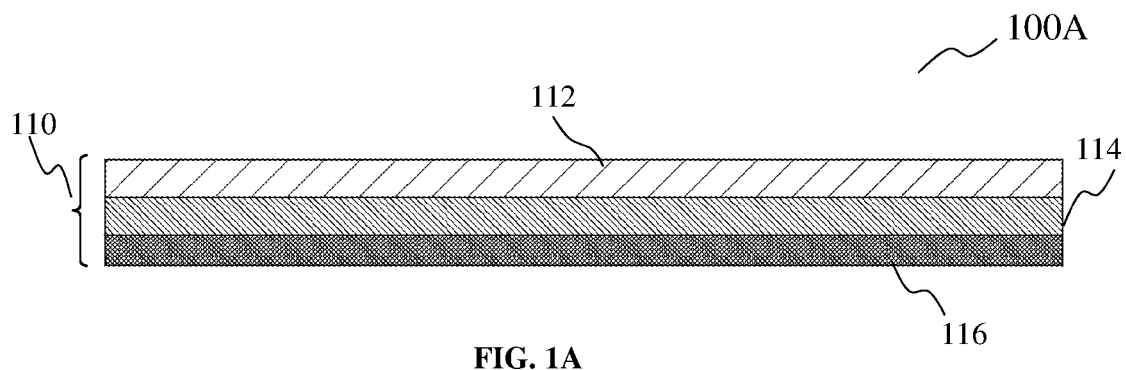
FIGS. 1A to 1N show a method of forming a microphone device according to various non-limiting embodiments.
Figure 1B:
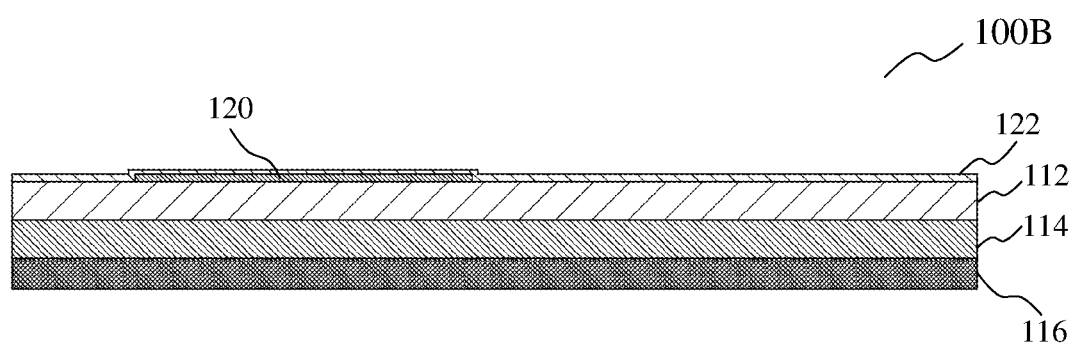
Figure 1C:
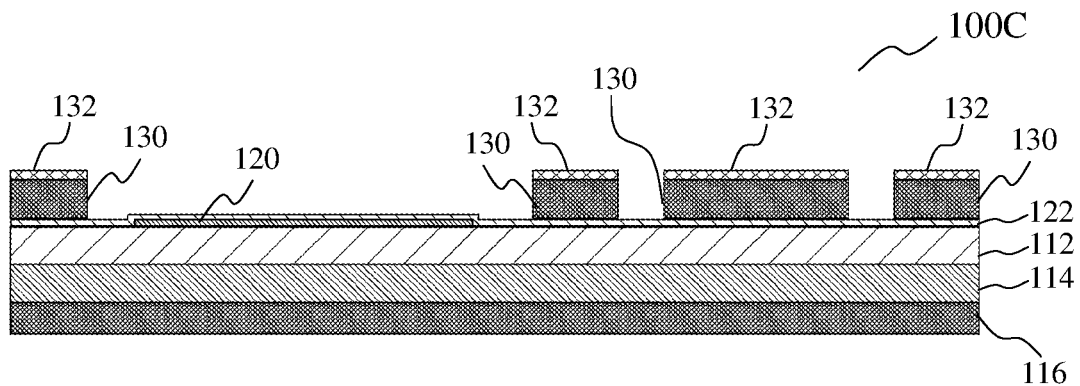
Figure 1D:
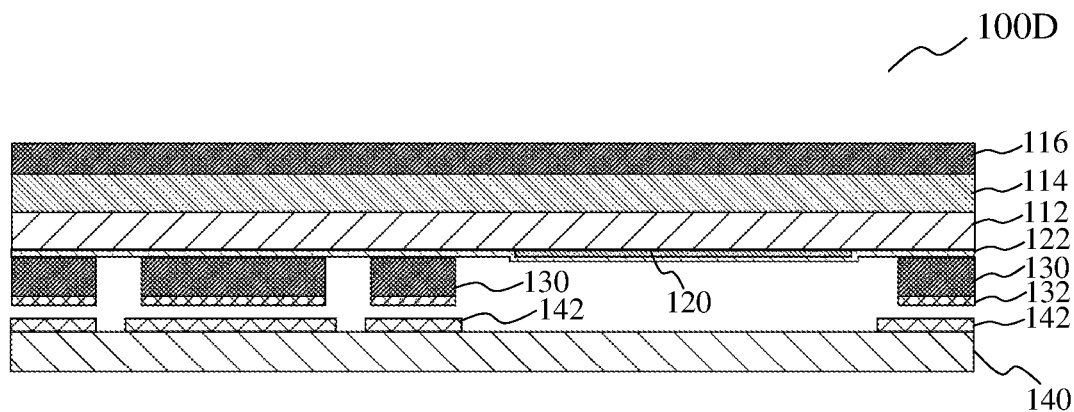
Figure 1E:
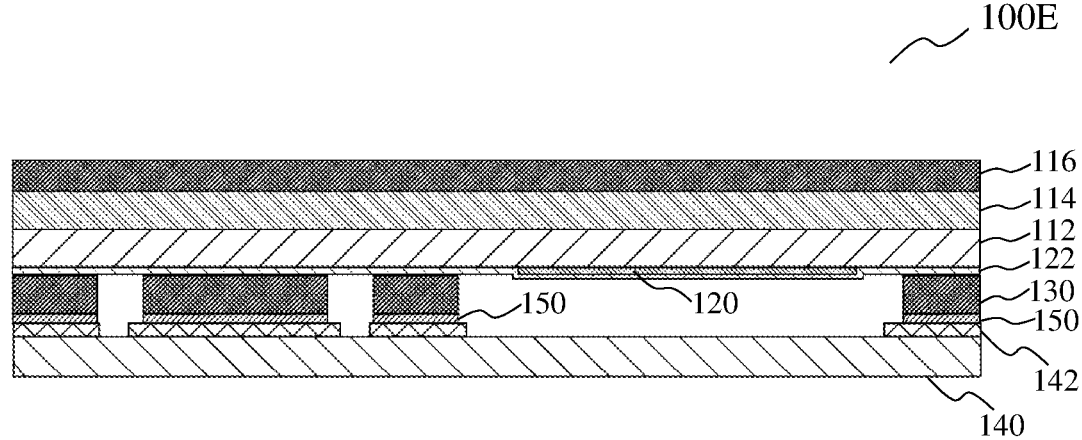
Figure 1F:
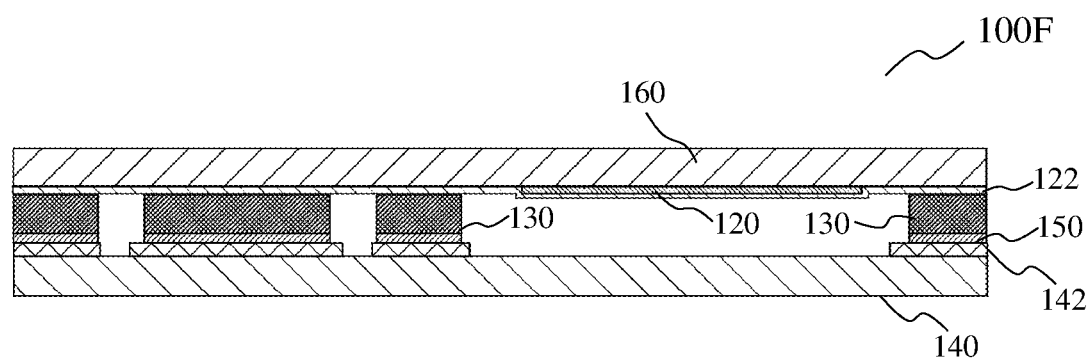
Figure 1G:
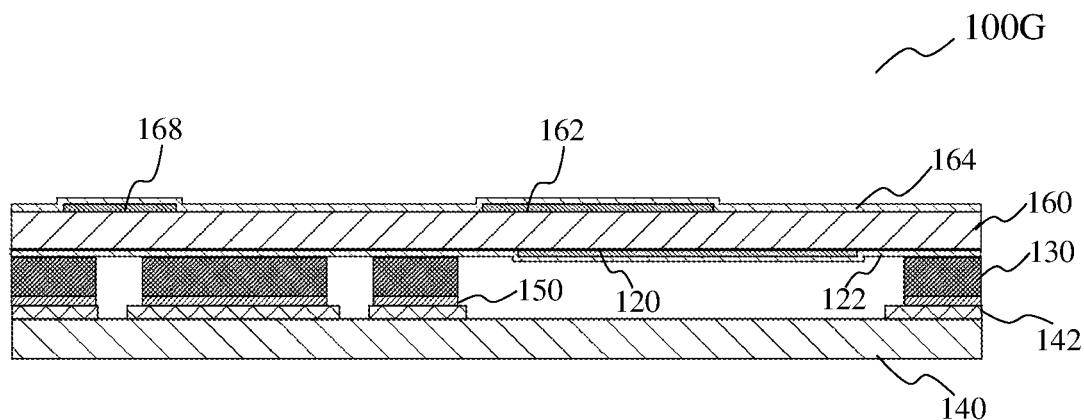
Figure 1H:
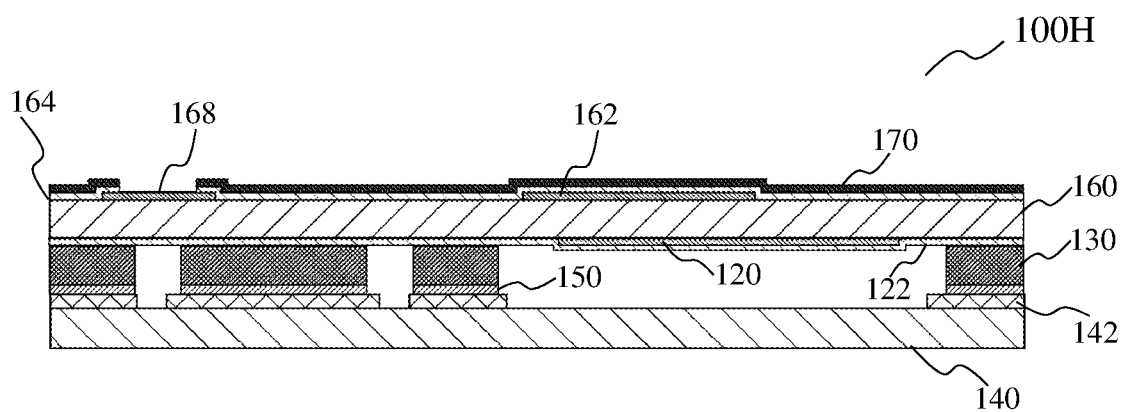
Figure 1I:
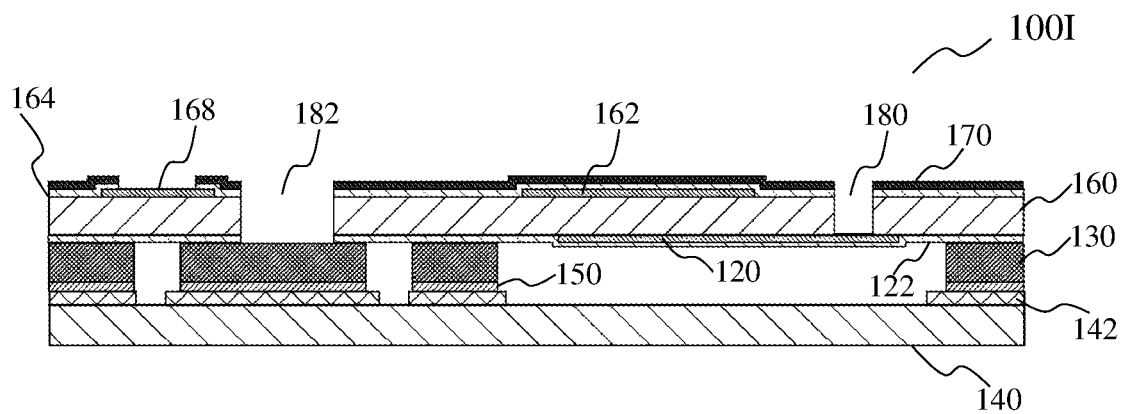
Figure 1J:
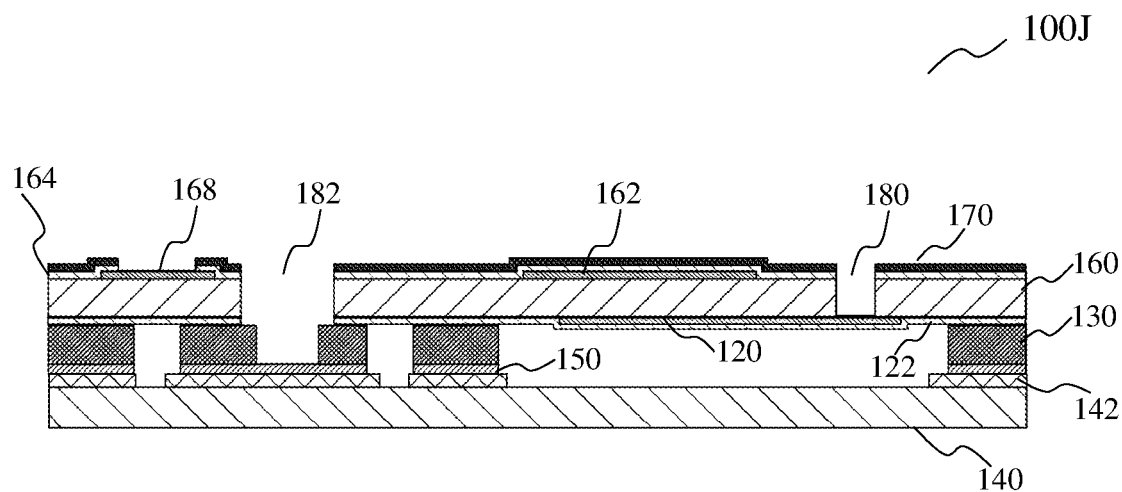
Figure 1K:
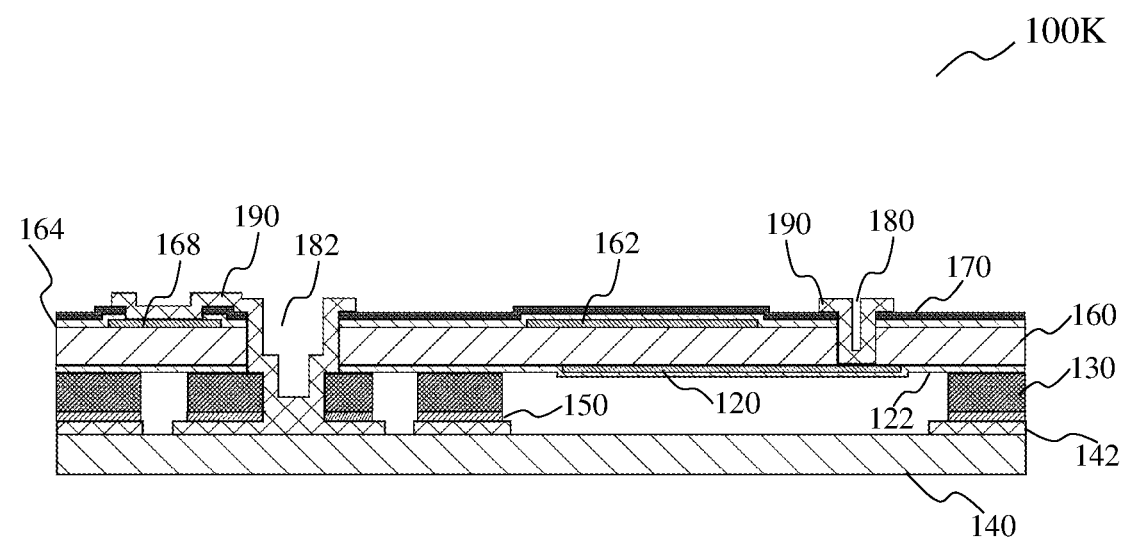
Figure 1L:
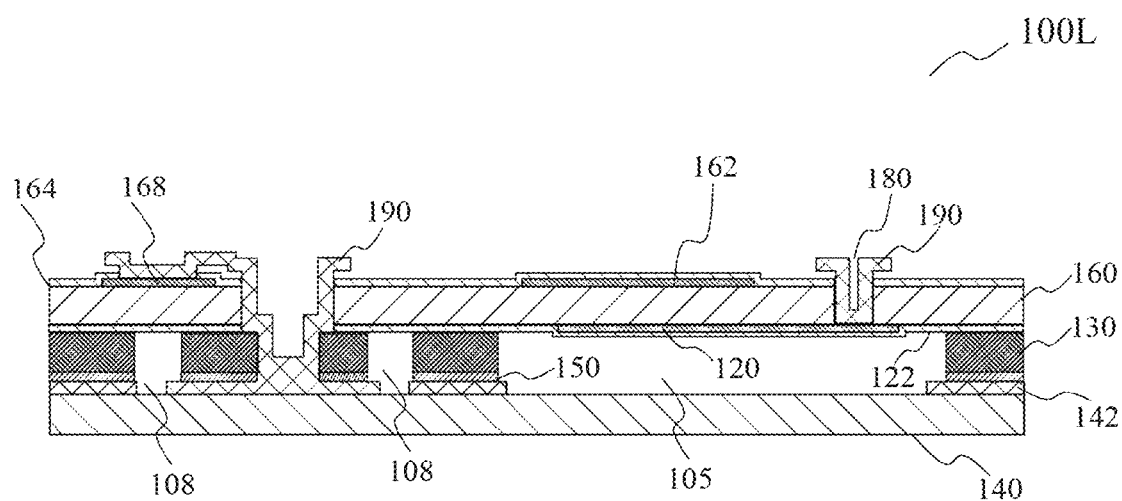
Figure 1M:
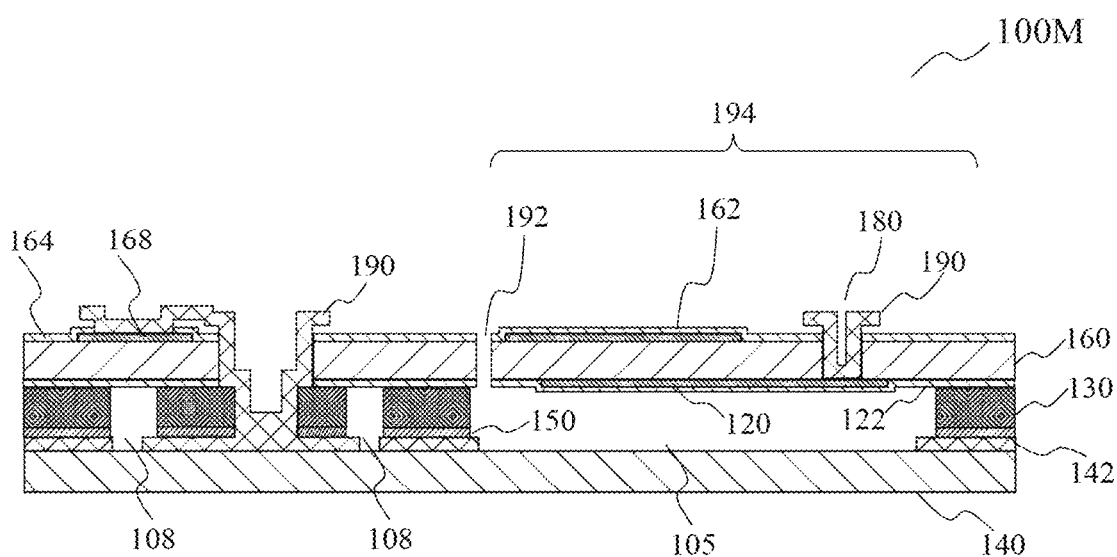
Figure 1N:
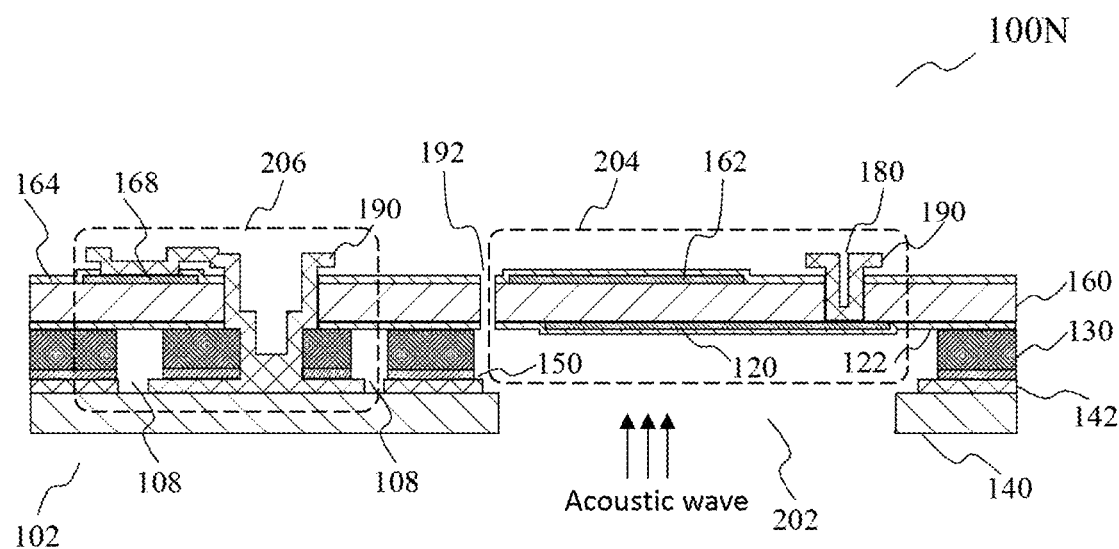

FIGS. 1A to 1N show a method of forming a microphone device 102 according to various non-limiting embodiments. FIG. 1A shows a process 100A. In the process 100A, a piezoelectric-on-insulator (POI) wafer 110 may be provided. The POI wafer 110 may include a piezoelectric layer 112, an insulator layer 114 and a substrate layer 116. The piezoelectric layer 112 may include a single piezoelectric crystal. The insulator layer 114 may serve to electrically insulate the piezoelectric layer 112 from the substrate layer 116. The insulator layer 114 may include an oxide, such as silicon dioxide. The substrate layer 116 may include a semiconductor material, such as silicon. Other types of material composition for the insulator layer 114 and the substrate layer 116 are acceptable, as these two layers will be subsequently removed.

FIG. 1B shows a process 100B. In the process 100B, a bottom electrode 120 may be formed. The process 100B may also include forming a bottom passivation layer 122. The electrode and passivation layer will be on a bottom surface of the piezoelectric layer 112 when the POI wafer 110 is flipped around and bonded to another wafer. Forming the bottom electrode 120 may include depositing a metal layer onto the piezoelectric layer 112, then patterning the metal layer using a first mask to form the bottom electrode 120. The metal layer may include molybdenum. Forming the bottom passivation layer 122 may include depositing a layer of etch-resistant material. The etch-resistant material may be resistant to etching by an etchant for silicon, such as sulfur hexafluoride ($SF_6$). The etch-resistant material may include aluminum nitride (AlN), aluminum oxide ($Al_2O_3$), or combinations thereof.

FIG. 1C shows a process 100C. The process 100C may include forming stand-off structures, also referred herein as support members 130. Forming the support members 130 may include depositing a support layer onto the bottom passivation layer 122. The process 100C may further include depositing a barrier material (not shown in the figure) over the support layer, before depositing a first bonding metal 132 over the support layer. The barrier material may prevent eutectic reaction or mixing of the support members 130 with the first bonding metal 132. The barrier material may include titanium. The first bonding metal 132 may include germanium (Ge). The support layer, the barrier material and the first bonding metal 132 may be etched using a second mask. The etching process may be carried out using an etchant which does not react with the bottom passivation layer 122. For example, the etchant may include $SF_6$. The bottom passivation layer 122 may protect the bottom electrode 120 from being etched away, during the formation of the support members 130. A suitable material for the support layer may be, for example, silicon. In embodiments where the support members are formed of silicon, the support members 130 may also be referred to as silicon pillars. The etching process may include deep reactive-ion etching (DRIE), which is a highly anisotropic etch process, so as to create steep side walls on the support members 130. The DRIE process may offer precise control of ±0.1° over the angle of side walls of the support members 130, as well as precise control over dimensions of ±50 nm. The side walls of the support members 130 may be at least substantially vertical. The side walls of the support members 130 may be at least substantially perpendicular, for example, 90°±0.1°, relative to the POI wafer 110 and also at least substantially perpendicular to a substrate wafer 140 that it is subsequently bonded to. After the etching process, a plurality of support members 130 coated with the barrier material and the first bonding metal 132 may remain. These support members 130 may subsequently serve to support a vibration member which includes the bottom electrode 120, a top electrode and a region of the piezoelectric layer 112 that lies between the bottom electrode 120 and the top electrode. As such, the support members 130 may be arranged laterally offset from the bottom electrode 120 so as not to obstruct movements of the vibration member. The dimension of the lateral offset may define device critical parameters, such as vibrating frequency range and quality factor. In other words, the dimension of the lateral offset may be selected to meet the desired characteristics of the microphone device.

FIG. 1D shows a process 100D. The process 100D may include providing a substrate wafer 140, flipping the POI wafer 110 from the process 100C and arranging the flipped POI wafer 110 over the substrate 140 as shown. The substrate wafer 140 may be a CMOS wafer, or may be a bare silicon wafer, or may be any other types of suitable wafers. A second bonding metal 142 may be deposited onto the substrate wafer 140. The second bonding metal 142 may be patterned to align with the first bonding metal 132 when the POI wafer 110 is flipped onto the substrate wafer 140. The second bonding metal 142 may include a metal that may form a eutectic alloy with the first bonding metal 132. For example, the second bonding metal 142 may include aluminum (Al) which may form an alloy with the Ge in the first bonding metal 132. By this process, the device that is eventually fabricated in the POI wafer 110 may be integrated with a CMOS wafer or other types of external circuit housed in the substrate wafer 140, without the extra cost related to system in package (SiP) approaches.

FIG. 1E shows a process 100E. The process 100E may include bonding the POI wafer 110 to the substrate wafer shown in process 100D. Eutectic bonding of the first bonding metal 132 to the second bonding metal 142 may form a bonding layer 150. The bonding process may take place at around 450 degrees Celsius. The bonding layer 150 may include an alloy of the first bonding metal 132 and the second bonding metal 142, such as Al/Ge. Part of the second bonding metal 142 may remain uncombined with the first bonding metal 132, and may subsequently form part of an interconnect layer.

FIG. 1F shows a process 100F. The process 100F may include removing the insulator layer 114 and the substrate layer 116 of the POI wafer 110, such that only the piezoelectric layer 112 of the initial POI wafer 110 remains. The substrate layer 116 may first be removed by a combination of grinding and etching. Next, the now exposed insulator layer 114 may be removed by etching, for example, using vapor hydrofluoric acid (VHF) etching or wet etching. The piezoelectric layer 112 may be further grinded or etched to reduce the thickness of the piezoelectric layer 112. The piezoelectric layer 112, or the reduced thickness piezoelectric layer, may be referred hereafter as a piezoelectric film 160.

FIG. 1G shows a process 100G. The process 100G may include forming a top electrode 162 on the piezoelectric film 160. Forming the top electrode 162 may including depositing a metal layer over the piezoelectric film 160 and then patterning the deposited metal layer using a third mask, similar to the process of forming the bottom electrode 120. The process 100G may also include forming a top passivation layer 164. The process of forming the top passivation layer 164 may be similar to the process of forming the bottom passivation layer 122. The top electrode 162 may have the same material composition as the bottom electrode 120. The top passivation layer 164 may have the same material composition as the bottom passivation layer 122. In the same process as forming the top electrode 162, a top electrical pad 168 may be formed using the third mask. The top electrical pad 168 may be connected to the top electrode 162 and may serve as an electrical contact point for external devices to connect to the top electrode 162.

FIG. 1H shows a process 100H. The process 100H may include adding an etch buffer layer 170. The etch buffer layer 170 may include a dielectric material, for example silicon dioxide. The process 100H may further include etching a region of the etch buffer layer 170 and the top passivation layer 164 that overlaps with the top electrical pad 168 using a fourth mask, so as to expose a top surface of the top electrical pad 168. The etch buffer layer 170 may prevent the top passivation layer 164 from being etched in the process 100K, as will be described with respect to FIG. 1K.

FIG. 1I shows a process 100I. The process 100I may include forming a first via 180 that reaches the bottom electrode 120. The process 100I may also include forming a second via 182 that reaches one of the support members 130. Forming the first via 180 and the second via 182 may include etching the etch buffer layer 170, the top passivation layer 164, the piezoelectric film 160, and the bottom passivation layer 122, using a fifth mask.

FIG. 1J shows a process 100J. The process 100J may include deepening the second via 182 so that it reaches to the bonding layer 150. Deepening the second via 182 may include etching the silicon pillar 130 under the second via 182, using a sixth mask.

FIG. 1K shows a process 100K. The process 100K may include forming an interconnect member 190. Forming the interconnect member 190 may include depositing an electrical conductor material over the semiconductor device from the process 100I and then etching the electrical conductor material using a seventh mask. The electrical conductor material may have the same material composition as the bonding layer 150. The interconnect member 190 may extend into the first via 180 and the second via 182, and may line the sidewalls of the vias. The etch buffer layer 170 may protect the top passivation layer 164 from being etched during the process of etching the electrical conductor material to form the interconnect member 190. In other words, the etch buffer layer 170 may serve as a sacrificial layer for the process of etching the electrical conductor material to form the interconnect member 190.

FIG. 1L shows a process 100L. The process 100L may include removing the etch buffer layer 170, for example, by using an etchant.

FIG. 1M shows a process 100M. The process 100M may include forming a release slit 192, which may be a through-hole in the piezoelectric film 160. The release slit 192 may be laterally offset from each of the top electrode 162 and the bottom electrode 120. The release slit 192 may be formed through an entire thickness of the piezoelectric film 160, and may extend from the top passivation layer 164 to the bottom passivation layer 122. The process 100M may include etching the piezoelectric film 160 using an eight mask. Forming the release slit 192 may include etching the piezoelectric film 160, as well as the top passivation layer 164 and the bottom passivation layer 122. The process of forming the release slit 192 may form a cantilever member 194 in the piezoelectric film 160. The release slit 192 may separate an active region 204 of the piezoelectric film 160 from the rest of the piezoelectric film 160. The active region 204 may at least partially overlap with at least one of the top electrode 162 and the bottom electrode 120. The cantilever member 194 may include the active region 204. The cantilever member 194 has a free end located beside the release slit 192, which may be displaceable out of a plane of the piezoelectric film 160. The cantilever member 194 may have an anchored end that may be restrained from being displaced out of the plane of the piezoelectric film 160. The anchored end may be fixed on the substrate wafer 140 by one of the support members 130.

FIG. 1N shows a process 100N. The process 100N may include forming a through-hole 202 in the substrate wafer 140. Forming the through-hole 202 may include etching the device obtained from the process 100M at the backside of the device. The through-hole 202 may be at least substantially aligned with at least one of the top electrode 162 and the bottom electrode 120. In other words, the through-hole 202 may be at least substantially aligned with the active region 204.

Figure 2:
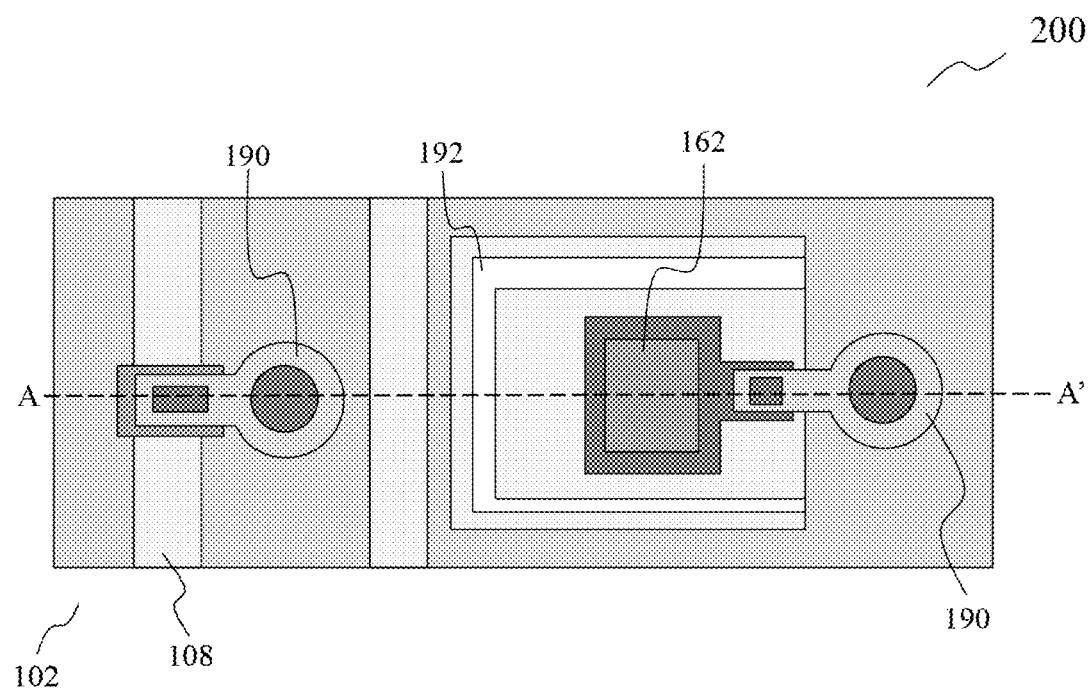
FIG. 2 shows a top view of the microphone device of FIG. 1N.

FIG. 2 shows a top view 200 of the microphone device 102 according to various non-limiting embodiments. FIG. 1N also shows a cross-sectional view of the microphone device 102 when the microphone device 102 is cut along the line AA'. The microphone device 102 may include a transducer. The microphone device 102 may include an active region 204 and a contact region 206. The active region 204 may include the top electrode 162, the bottom electrode 120 and a portion of the piezoelectric film 160 arranged between these electrodes. The contact region 206 may include the interconnect member 190, the top electrical pad 168, a region of the bonding layer 150 underlying the second via 182, and a region of the second bonding metal 142 underlying the second via 182. The support members 130 may support the piezoelectric film 160 over a cavity 105 between the piezoelectric film 160 and the substrate wafer 140. The support members may provide a precise boundary for the resonator region 104. The support member may be formed out of silicon, thereby allowing precise angles to be etched. There may be one or more air gaps 108 between every two adjacent support members 130. The air gaps 108 are empty spaces that electrically insulate the adjacent support members 130. Airflow, which may include acoustic waves, may enter the microphone device 102 via the through-hole 202, to come into contact with the active region 204. Acoustic waves may enter the microphone device 102 and cause the cantilever member 194 to vibrate out-of-plane. The piezoelectric film 160 may convert vibrations in the active region 204, i.e. an acoustic signal, into electrical signals. The top electrode 162 and the bottom electrode 120 may carry the electrical signals to the contact region 206 by electrical conduction. The electrical signals that are indicative of the acoustic signal, may be output from the microphone device 102 through the contact region 206.

Figure 3:
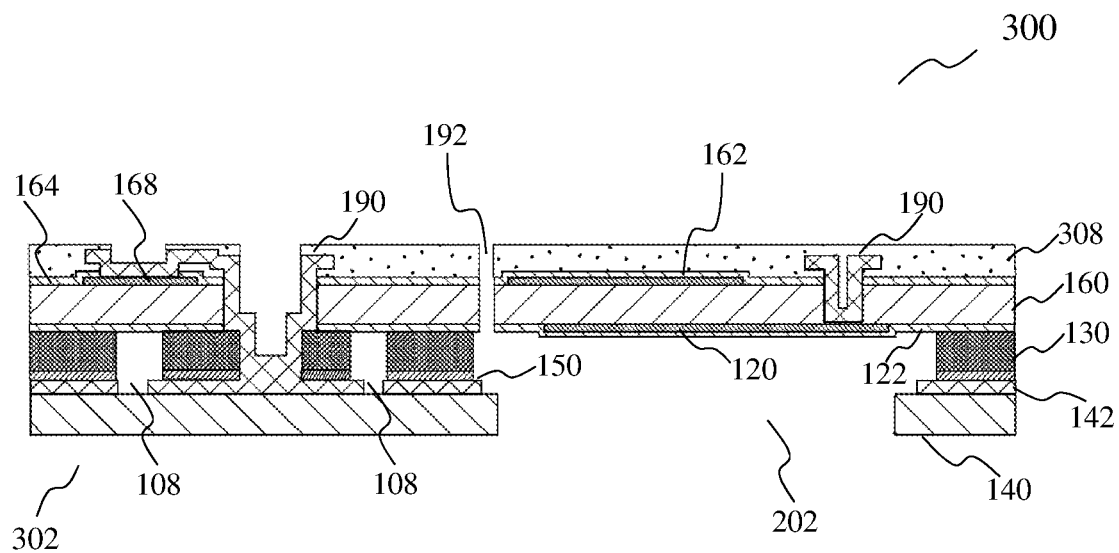
FIG. 3 shows a process, as well as a cross-sectional view of a microphone device according to various non-limiting embodiments.
Figure 4:
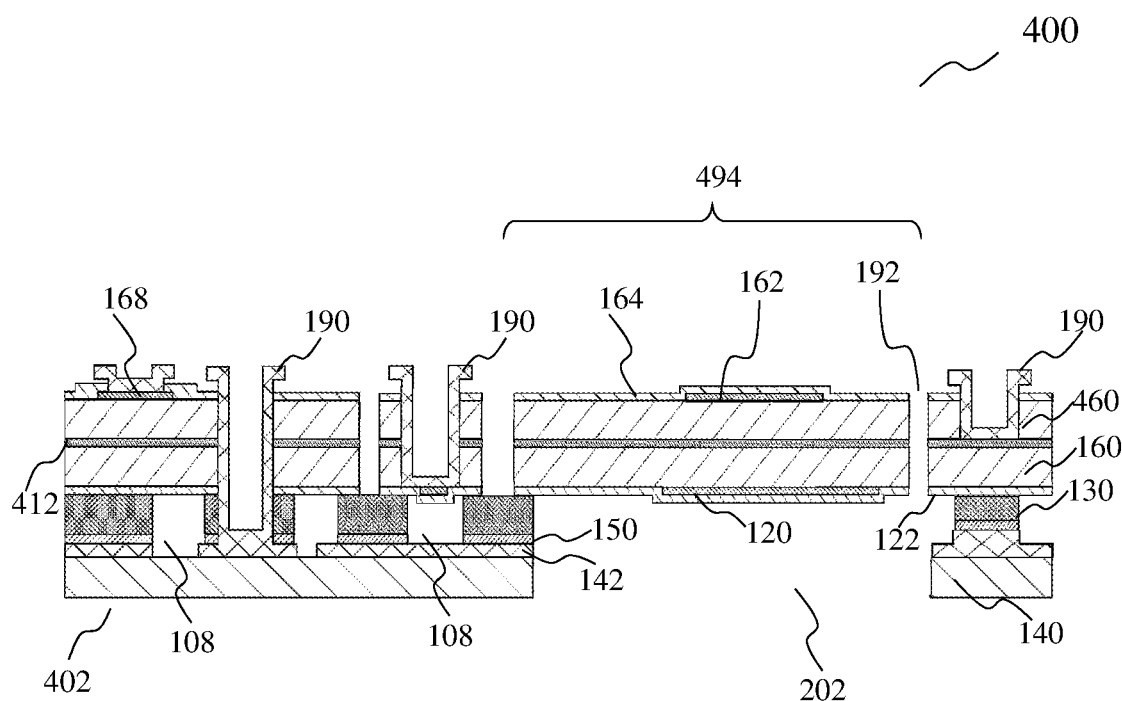
FIG. 4 shows a cross-sectional view of a microphone device according to various non-limiting embodiments.

FIG. 3 shows a process 300, as well as a cross-sectional view of a microphone device 302 according to various non-limiting embodiments. The process 300 may include depositing a dielectric layer 308 over the microphone device 102. The dielectric layer 308 may be deposited by chemical vapor deposition (CVD). The dielectric layer 308 may be provided above the piezoelectric film 160, for example, adjacent to the top passivation layer 164. Alternatively, or additionally, the dielectric layer 308 may be provided under the piezoelectric film 160, for example, adjacent to the bottom passivation layer 122. The dielectric layer 308 may include at least one of silicon oxide, silicon nitride or other dielectric materials. Following the deposition of the dielectric layer 308, the dielectric layer 308 may be etched, so as to provide access to the contact region 206. The dielectric layer 308 may distribute stress exerted on it at least substantially uniformly. As such, the dielectric layer 308 may pull the neutral axis of the cantilever member 194 out of the piezoelectric film 160, thereby improving the ability of the cantilever member 194 to transduce acoustic signals to electrical signals. Consequently, the microphone device 302 may have an improved performance as compared to the microphone device 102. FIG. 4 shows a cross-sectional view 400 of a microphone device 402 according to various non-limiting embodiments. The microphone device 402 may be similar to the microphone device 102 but may differ from the microphone device 102 in that it has a bimorph cantilever member 494. In other words, the microphone device 402 may include two piezoelectric films, 160 and 460. The microphone device 402 may include an intermediate electrode layer 412 that lies between the piezoelectric film 160 and the further piezoelectric film 460. The top electrode 162 may be arranged adjacent to, and above, the further piezoelectric film 460. The bottom electrode 120 may be arranged adjacent to, and below, the piezoelectric film 160. The interconnect may include an electrical connection to the intermediate electrode layer 412.

According to various non-limiting embodiments, a microphone device may be provided. The microphone device may be any one of the microphone devices 102, 302 and 402. The microphone device may include a substrate wafer, such as the substrate wafer 140. The substrate wafer may have a through-hole 202 formed therein. The microphone device may include a support member, for example, the support member 130. The support member may be bonded to a front surface of the substrate wafer. The microphone device may include a single-crystal piezoelectric film, such as the piezoelectric film 160 or the piezoelectric layer 112. The single-crystal piezoelectric film may have a first surface and an opposing second surface. The single-crystal piezoelectric film may be provided over the support member. The microphone device may include a top electrode arranged adjacent to the first surface of the single-crystal piezoelectric film, and a bottom electrode arranged adjacent to the second surface of the single-crystal piezoelectric film. The top electrode may be the top electrode 162. The bottom electrode may be the bottom electrode 120. The through-hole 202 of the substrate wafer may be at least substantially aligned with at least one of the top electrode and the bottom electrode. The piezoelectric film may have a release slit, such as the release slit 192 formed therein, such that part of the piezoelectric film may form a cantilever member. The cantilever member may be the cantilever member 194. The cantilever member 194 may have a moveable end that may vibrate out of a plane of the piezoelectric film when acoustic waves are received through the through-hole of the substrate wafer.

According to various non-limiting embodiments, the microphone device may include a further single-crystal piezoelectric film provided over at least a portion of the top electrode, and a further electrode arranged over the further single-crystal piezoelectric film. The further single-crystal piezoelectric film may be the piezoelectric film 460. In this embodiment, the top electrode may be the intermediate electrode layer 412, and the further electrode may be the top electrode 162. The top electrode may at least substantially cover the first surface of the single-crystal piezoelectric film. The further single-crystal piezoelectric film may have the same dimensions as the single-crystal piezoelectric film. The further single-crystal piezoelectric film may be identical in composition, as the single-crystal piezoelectric film.

According to various non-limiting embodiments, the support member may include a plurality of silicon pillars. Each silicon pillar may have side walls that are perpendicular to the front surface of the substrate wafer. Each silicon pillar may be electrically isolated from adjacent support members by one or more air gaps.

According to various non-limiting embodiments, the microphone device may further include a bonding layer provided over at least part of the front surface of the substrate wafer. The support member may be bonded to the substrate wafer by the bonding layer. The bonding layer may include the bonding layer 150. The bonding layer may additionally include the second bonding metal 142. The bonding layer may include at least one of aluminum, germanium, or combinations thereof.

According to various non-limiting embodiments, the microphone device may further include a top passivation layer arranged adjacent to the first surface of the single-crystal piezoelectric film and enclosing the top electrode therein, and a bottom passivation layer arranged adjacent to the second surface of the single-crystal piezoelectric film and enclosing the bottom electrode therein. The top passivation layer may include the top passivation layer 164. The bottom passivation layer may include the bottom passivation layer 122. Each of the top passivation layer and the bottom passivation layer may include a material that is resistant to etching by $SF_6$. The microphone device may further include an interconnect member at least partially arranged over the first surface of the single-crystal piezoelectric film and extending down through a via in the single-crystal piezoelectric film to reaching the bonding layer. The interconnect member may be the interconnect member 190. The interconnect member and the bonding layer may include the same material composition.

According to various non-limiting embodiments, the microphone device may further include a dielectric layer provided adjacent to the single-crystal piezoelectric film. The dielectric layer may include the dielectric layer 308. The second surface of the single-crystal piezoelectric film may face the front surface of the substrate wafer. The dielectric layer may be adjacent to the first surface of the single-crystal piezoelectric film. Alternatively, the dielectric layer may be adjacent to the second surface of the single-crystal piezoelectric film.

According to various non-limiting embodiments, each of the top electrode and the bottom electrode includes a plurality of finger members. The plurality of finger members of the top electrode may at least substantially overlap with the plurality of finger members of the bottom electrode.

According to various non-limiting embodiments, at least one of the top electrode and the bottom electrode may include segments of different thicknesses.

According to various non-limiting embodiments, the single-crystal piezoelectric film may include segments of different thicknesses.

Figure 5:
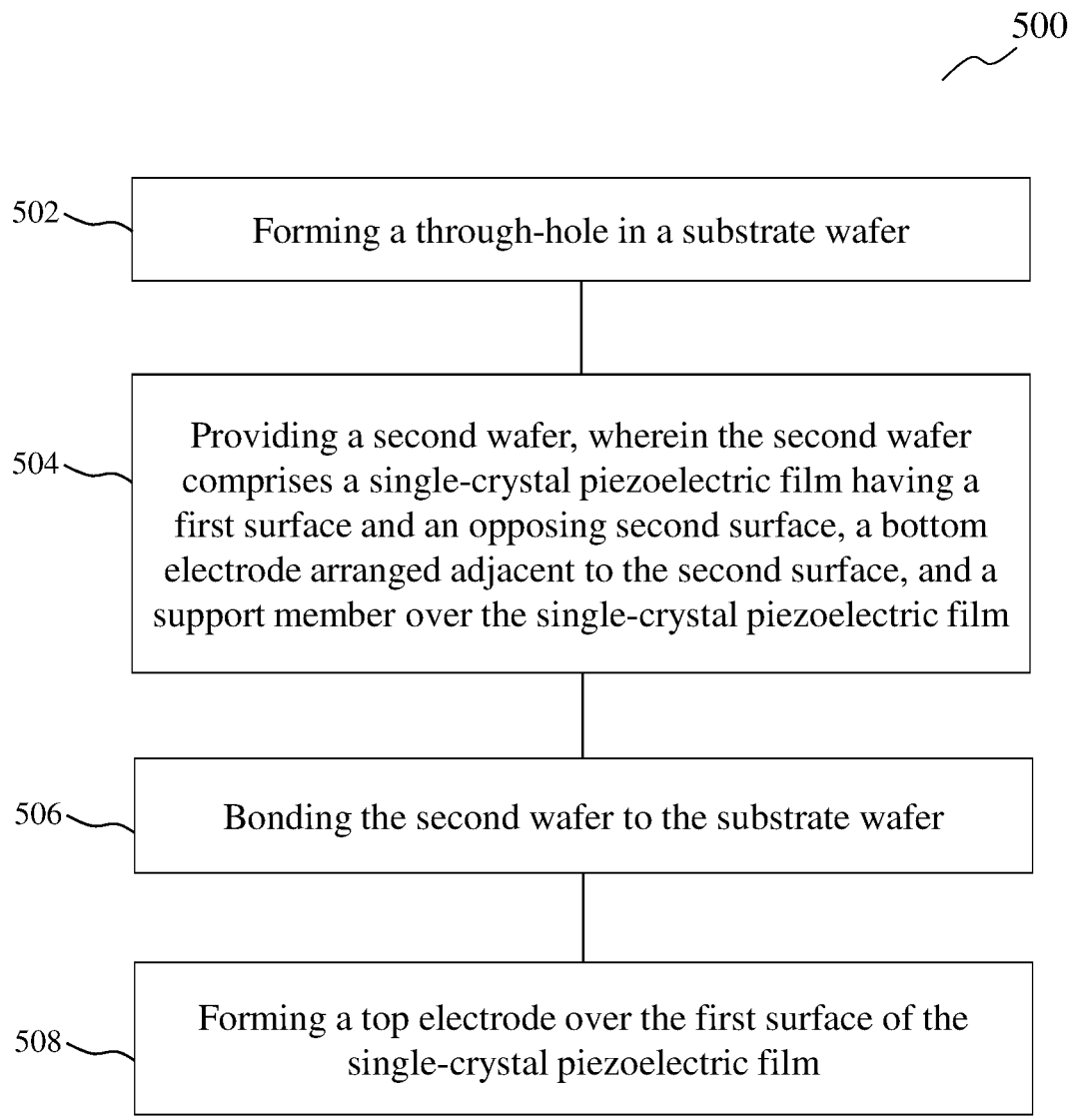
FIG. 5 shows a flow diagram of a method for forming a microphone device according to various non-limiting embodiments.

FIG. 5 shows a flow diagram 500 of a method for forming a microphone device according to various non-limiting embodiments. The microphone device may be any one of the microphone devices 102, 302 and 402. The method may include forming a through-hole 202 in a substrate wafer, in 502. 502 may include the process 100N. The substrate wafer may be the substrate wafer 140. The method may include providing a second wafer, in 504. The second wafer may include a single-crystal piezoelectric film having a first surface and an opposing second surface, a bottom electrode arranged adjacent to the second surface of the single-crystal piezoelectric film, and a support member arranged over the second surface of the single-crystal piezoelectric film. The single-crystal piezoelectric film may include the piezoelectric film 160 or the piezoelectric layer 112. The support member may include the support members 130. The bottom electrode may be the bottom electrode 120. 504 may include the processes 100A to 100C. The method may include bonding the second wafer to the substrate wafer, in 506. 506 may include the process 100E. The method may include forming a top electrode over the first surface of the single-crystal piezoelectric film, in 508. The top electrode may be the top electrode 162. The through-hole 202 in the substrate wafer may be at least substantially aligned with at least one of the top electrode and the bottom electrode.

According to various non-limiting embodiments, providing the second wafer in 504, may include providing a POI wafer, like in the process 100A. The POI wafer may be the POI wafer 110. The POI wafer may include the single-crystal piezoelectric film, an insulator layer and a substrate layer. Providing the second wafer may further include depositing a first metal layer on the second surface of the single-crystal piezoelectric film, and patterning the first metal layer to form the bottom electrode, like in the process 100B. Providing the second wafer may further include forming the support member over the second surface of the single-crystal piezoelectric film, like in the process 100C. Forming the support member may include depositing silicon over the second surface of the single-crystal piezoelectric film, and patterning the deposited silicon to form a plurality of silicon pillars.

According to various non-limiting embodiments, in 508, providing the top electrode may include removing the insulator layer and the substrate layer after the second wafer is bonded to the substrate wafer, like in the process 100F. Removal of the insulator layer and the substrate layer may expose the first surface of the single-crystal piezoelectric film. Providing the top electrode may include depositing a second metal layer on the first surface of the single-crystal piezoelectric film, and patterning the second metal layer to form the top electrode.

According to various non-limiting embodiments, the method may further include providing a first passivation layer over the first surface of the single-crystal piezoelectric film and the top electrode to enclose the top electrode. The method may further include providing a second passivation layer over the second surface of the single-crystal piezoelectric film and the bottom electrode to enclose the bottom electrode.

According to various non-limiting embodiments, the second wafer may further include a further single-crystal piezoelectric film stacked over the single-crystal piezoelectric film, and a middle electrode provided between the single-crystal piezoelectric film and the further single-crystal piezoelectric film. The middle electrode may include the intermediate electrode layer 412.

According to various non-limiting embodiments, the method may further include providing a dielectric layer over the single-crystal piezoelectric film. Providing the dielectric layer may include depositing the dielectric material by CVD.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

It will be appreciated to a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. A microphone device comprising:
   a substrate wafer having a through-hole formed therein;
   a support member bonded to a front surface of the substrate wafer;
   a single-crystal piezoelectric film provided over the support member, wherein the single-crystal piezoelectric film has a first surface and an opposing second surface;
   a top electrode arranged adjacent to the first surface of the single-crystal piezoelectric film; and a bottom electrode arranged adjacent to the second surface of the single-crystal piezoelectric film;

wherein the support member comprises a plurality of support members;

wherein the plurality of support members are separated from each other by one or more air gaps;

wherein the one or more air gaps are laterally separated from the through-hole of the substrate wafer;

wherein the through-hole of the substrate wafer is at least substantially aligned with at least one of the top electrode and the bottom electrode.

2. The microphone device of claim 1, further comprising:
a further single-crystal piezoelectric film provided over at least a portion of the top electrode; and
a further electrode arranged over the further single-crystal piezoelectric film.

3. The microphone device of claim 2, wherein the top electrode at least substantially covers the first surface of the single-crystal piezoelectric film.

4. The microphone device of claim 2, wherein the further single-crystal piezoelectric film has the same dimensions as the single-crystal piezoelectric film.

5. The microphone device of claim 1, wherein the plurality of support members comprises multiple silicon pillars, and each silicon pillar of the plurality of support members has side walls that are perpendicular to the front surface of the substrate wafer.

6. The semiconductor device of claim 1, wherein the plurality of support members comprises multiple silicon pillars, and each silicon pillar is electrically isolated from adjacent support members by one or more air gaps.

7. The microphone device of claim 1, further comprising:
a bonding layer provided over at least part of the front surface of the substrate wafer;
wherein the support member is bonded to the substrate wafer by the bonding layer.

8. The microphone device of claim 1, further comprising:
a top passivation layer arranged adjacent to the first surface of the single-crystal piezoelectric film and enclosing the top electrode therein; and
a bottom passivation layer arranged adjacent to the second surface of the single-crystal piezoelectric film and enclosing the bottom electrode therein.

9. The microphone device of claim 1, further comprising:
a dielectric layer provided adjacent to the single-crystal piezoelectric film.

10. The microphone device of claim 9, wherein the second surface of the single-crystal piezoelectric film faces the front surface of the substrate wafer, wherein the dielectric layer is adjacent to the first surface of the single-crystal piezoelectric film.

11. The microphone device of claim 10, wherein the second surface of the single-crystal piezoelectric film faces the front surface of the substrate wafer, wherein the dielectric layer is adjacent to the second surface of the single-crystal piezoelectric film.

* * * * *